United States Patent
Bandhu et al.

(10) Patent No.: US 9,532,490 B2
(45) Date of Patent: Dec. 27, 2016

(54) ELECTROMAGNETIC INTERFERENCE GASKET

(71) Applicant: 3M INNOVATIVE PROPERTIES COMPANY, St. Paul, MN (US)

(72) Inventors: Saujit Bandhu, Singapore (SG); YunLong Qiao, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/903,626

(22) PCT Filed: Jul. 21, 2014

(86) PCT No.: PCT/US2014/047357
§ 371 (c)(1),
(2) Date: Jan. 8, 2016

(87) PCT Pub. No.: WO2015/013160
PCT Pub. Date: Jan. 29, 2015

(65) Prior Publication Data
US 2016/0157393 A1 Jun. 2, 2016

Related U.S. Application Data

(60) Provisional application No. 61/857,746, filed on Jul. 24, 2013.

(51) Int. Cl.
*H05K 9/00* (2006.01)
*H01R 13/648* (2006.01)

(52) U.S. Cl.
CPC .......... *H05K 9/0015* (2013.01); *H05K 9/0016* (2013.01); *H05K 9/0018* (2013.01)

(58) Field of Classification Search
CPC ... H05K 9/0015; H05K 9/0016; H05K 9/0018
(Continued)

(56) References Cited

U.S. PATENT DOCUMENTS

| 4,061,413 A | 12/1977 | Keller |
| 4,386,814 A * | 6/1983 | Asick .................. H01R 13/648 |
| | | 439/607.28 |

(Continued)

FOREIGN PATENT DOCUMENTS

| DE | 963 620 | 5/1957 |
| EP | 1 231 827 | 4/2002 |

(Continued)

OTHER PUBLICATIONS

PCT International Search Report for PCT/US2014/047357 mailed on Jan. 7, 2015, 3 pages.

(Continued)

*Primary Examiner* — Sherman Ng
(74) *Attorney, Agent, or Firm* — Robert S. Moshrefzadeh

(57) ABSTRACT

An electrically conductive gasket for use with an electrical component, including an electrically conductive base defining a central opening therein for receiving a portion of an electrical component, a first row of spaced apart resilient conductive tabs arranged around the central opening, and a second row of spaced apart resilient conductive tabs arranged around the central opening, the first row being located inside the second row. The conductive tabs in the first and second rows of the spaced apart resilient conductive tabs extend outwardly from the conductive base and are configured to resiliently deflect when the gasket is compressed. The conductive tabs in the first and second rows of the spaced apart resilient conductive tabs are staggered relative to each other, such that in an edge view of the gasket, at least one conductive tab in one row partially overlaps at least one conductive tab in the other row.

24 Claims, 5 Drawing Sheets

(58) Field of Classification Search
USPC .... 174/350, 351, 355; 439/607.01; 361/816, 361/818
See application file for complete search history.

(56) References Cited

U.S. PATENT DOCUMENTS

| | | | |
|---|---|---|---|
| 4,626,615 A | 12/1986 | Van Dyk, Jr. | |
| 5,204,496 A | 4/1993 | Boulay | |
| 5,317,105 A * | 5/1994 | Weber | H01R 13/6584 174/355 |
| 5,959,244 A | 9/1999 | Mayer | |
| 6,063,999 A * | 5/2000 | Kelly | H05K 9/0028 174/351 |
| 6,206,730 B1 * | 3/2001 | Avery | H01R 23/6873 439/607.18 |
| 6,239,358 B1 * | 5/2001 | Chang | H05K 9/0016 174/354 |
| 6,478,622 B1 * | 11/2002 | Hwang | H01R 13/65802 385/92 |
| 6,618,271 B1 * | 9/2003 | Erickson | G06F 1/182 174/382 |
| 6,878,872 B2 | 4/2005 | Lloyd | |
| 6,943,287 B2 | 9/2005 | Lloyd | |
| 7,104,843 B2 * | 9/2006 | Olson | H01R 13/41 174/355 |
| 7,227,538 B2 | 6/2007 | Geaghan | |
| 7,455,554 B2 | 11/2008 | Long | |
| 8,039,763 B1 | 10/2011 | Cochrane | |
| 2007/0128936 A1 | 6/2007 | Long | |
| 2008/0038959 A1 | 2/2008 | Barringer | |
| 2008/0060842 A1 * | 3/2008 | Barringer | H01R 13/65802 174/354 |
| 2008/0296850 A1 * | 12/2008 | Megason | H05K 9/0016 277/595 |
| 2008/0315528 A1 | 12/2008 | Moore | |
| 2013/0072063 A1 | 3/2013 | Qiao | |

FOREIGN PATENT DOCUMENTS

| | | |
|---|---|---|
| WO | WO 2007/067496 | 6/2007 |
| WO | WO 2011/156354 | 12/2011 |
| WO | WO 2012/071236 | 5/2012 |

OTHER PUBLICATIONS

Armstrong, "Design Techniques for EMC—Part 4 Shielding", http://www.compliance-club.com/archive/old_archive/990810.htm retrieved on Oct. 11, 2012, pp. 1-22.

* cited by examiner

ELECTROMAGNETIC INTERFERENCE GASKET

TECHNICAL FIELD

The present invention relates to electromagnetic interference gaskets, and more particularly to electromagnetic interference gaskets intended for use with shielding cages that provide protection and shielding from electromagnetic interference.

BACKGROUND

It is a common practice to connect a cable to a printed circuit board (PCB) by utilizing a plug connector at an end of the cable which is intended for insertion into an opposing mating connector. The mating connector is typically mounted on the PCB placed within a housing of an electronic device. There may be other electronic modules mounted on the PCB. Each electronic module may emit electromagnetic interference (EMI) that can interfere and negatively influence the signals transmission between the connectors.

The mating connector may be shielded from EMI by using a metal shielding cage (sometimes referred to as an EMI shielding cage) that is also mounted on the PCB and which surrounds the mating connector in the electronic device. The cage has an opening which opens to a faceplate. The opening defines an entrance leading towards the mating connector into which the plug connector is inserted. However, even with the use of the cage, EMI may still be present, primarily at the area where the cage meets the PCB and around the opening of the faceplate into which the cage opening extends.

Conductive gaskets of various forms have been developed to address this problem. U.S. Pat. No. 6,878,872 (Lloyd et al.) purportedly discloses an electrically conductive compressible gasket for a shielding cage with multiple module receiving bays. However, gaskets made using conductive foams can be prone to tearing and other damage. Further, the degree of EMI protection may be dependent on the amount of conductive material in the conductive foam.

For the benefit of consumers, standards have been established within the electronics industry, especially in the areas of connector mechanical interfaces, signal and data transmission protocols, and signal and data exchange protocols. This interoperability will allow an electronic module that is made by one vendor to be replaceable with a similar module from another vendor. Thus, consumers will have more product choices and can benefit from this competition with more competitive device pricing.

In the electronics industry, there are many standards committees including, but not limited to, the Institute of Electric and Electronic Engineers (IEEE) Committee which governs the specifications for data communication, the T10 Committee which defines the standards for data storage, and the Small Form Factor (SFF) Committee which specifies the standards for mechanical interfaces for connectors. SFF 8088 is one such standard set by the SFF Committee and it is a specification for mini multi-lane shielded connectors.

For reasons provided earlier, there is motivation for manufacturers to use conductive metallic gaskets instead of conductive foam gaskets for EMI shielding for their electronic devices. U.S. Pat. No. 7,455,554 (Long) purportedly discloses an EMI shroud with bidirectional contact members. At this moment, the use of a conductive metallic gasket would cause the connectors to be SFF 8088 non-compliant.

SUMMARY

The present disclosure provides an electrically conductive gasket for use with an electrical component. The electrically conductive gasket includes an electrically conductive base defining an opening therein for receiving a portion of an electrical component. A first row of spaced apart resilient conductive tabs is arranged around the opening, and a second row of spaced apart resilient conductive tabs is also arranged around the opening. The first row is located inside the second row (i.e., the first row is nearer to the opening than is the second row). The conductive tabs in the first and second rows of the spaced apart resilient conductive tabs extend outwardly from the conductive base, and are configured to resiliently deflect when the gasket is compressed. The conductive tabs in the first and second rows of the spaced apart resilient conductive tabs are staggered relative to each other, such that in an edge view of the gasket, each conductive tab in one row partially overlaps at least one conductive tab in the other row.

DETAILED DESCRIPTION

Figure 1:
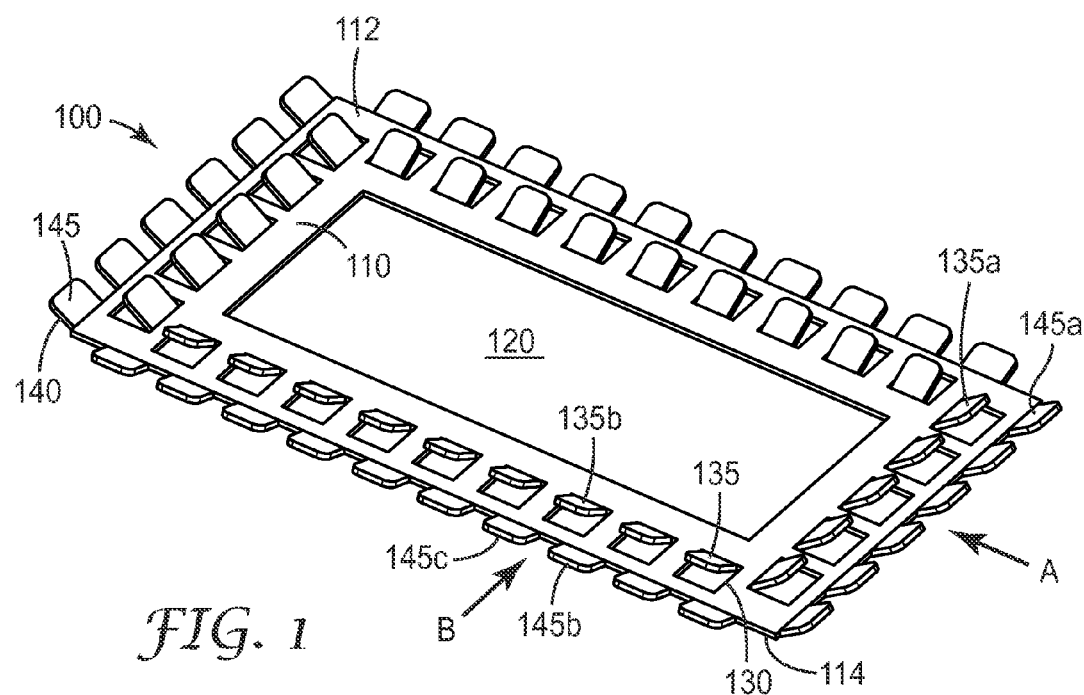
FIG. 1 is an exemplary perspective view of an electromagnetic interference (EMI) gasket.

Electrically conductive gaskets are provided. More specifically, an electrically conductive gasket includes a central opening and resilient conductive tabs spaced apart around the central opening. The spaced apart resilient conductive tabs are arranged in rows. The rows are arranged such that in an edge view of the gasket, spaced apart resilient conductive tabs in a first row at least partially overlap spaced apart resilient conductive tabs in a second row. The electrically conductive gasket can provide an enhanced protection against electromagnetic interference (EMI) when used with an electrical component (e.g., a plug connector).

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "side," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

For the following Glossary of defined terms, these definitions shall be applied for the entire application, unless a different definition is provided in the claims or elsewhere in the specification.

GLOSSARY

The terms "conductive" and "electrically conductive" refer to the property of a material having an electrical resistance value of less than $10^6$ ohms.

The term "resilient" refers to the property of a material that enables it to resume its original shape after being bent or deflected.

In a first aspect, an electrically conductive gasket is provided. More particularly, an electrically conductive gasket is provided comprising an electrically conductive base defining a central opening therein. The central opening is suitable for receiving a portion of an electrical component (e.g., a plug connector). A first row of spaced apart resilient conductive tabs is arranged around the central opening, and a second row of spaced apart resilient conductive tabs is arranged around the central opening. The first row is located inside the second row (i.e., the first row is nearer to the central opening than is the second row). The conductive tabs in the first and second rows of the spaced apart resilient conductive tabs extend outwardly from the conductive base, and are configured to resiliently deflect when the gasket is compressed. The conductive tabs in the first and second rows of the spaced apart resilient conductive tabs are staggered relative to each other, such that in an edge view of the gasket, each conductive tab in one row partially overlaps at least one conductive tab in the other row. Optionally, each conductive tab in the first row partially overlaps each of two adjacent conductive tabs in the second row. Optionally, the electrically conductive gasket is of unitary construction.

In a second aspect, an electrically conductive gasket is provided for use with an electrical component, including an electrically conductive base defining a central opening therein for receiving a portion of an electrical component, and two or more substantially parallel spaced apart polygonal rows of spaced apart resilient conductive tabs disposed on the base and surrounding the central opening. Each edge of each row includes one or more resilient conductive middle tabs disposed between two resilient conductive end tabs. Each middle tab in one row at least partially overlapping two middle tabs in an adjacent row. Optionally, the electrically conductive gasket is of unitary construction.

The following description of embodiments of the present disclosure relates to any one or more of the above two aspects.

In some embodiments, the electrically conductive gasket is formed from a conductive metal (e.g., stainless steel), although this is not a requirement. In some other embodiments, the electrically conductive gasket can be formed from a resilient plastic or other resilient material that is coated with conductive material (e.g., plated with a conductive metal) on its exterior surfaces.

FIG. 1 provides an exemplary schematic of an electrically conductive gasket 100 according to certain embodiments of the disclosure. The electrically conductive gasket 100 includes an electrically conductive base 110 defining a central opening 120 for receiving a portion of an electrical component (electrical component not shown). The electrical component can be, for example, a plug connector or a portion of an EMI shielding cage. Gasket 100 has a plurality of sides which preferably form a unitary structure. The electrically conductive base 110 further comprises a first row 130 of spaced apart resilient conductive tabs 135 arranged around central opening 120. Preferably, first row 130 of spaced apart resilient conductive tabs 135 extends around the entire perimeter of central opening 120, as in the embodiment shown in FIG. 1. In other embodiments (not shown), first row of spaced apart resilient conductive tabs 135 may extend along only a portion of the perimeter of central opening 120.

Electrically conductive base 110 further comprises a second row 140 of spaced apart resilient conductive tabs 145, also arranged around central opening 120. First row 130 is located inside row 140 (i.e., first row 130 is nearer than second row 140 to central opening 120). Preferably, second row 140 of spaced apart resilient tabs 145 extends around the entire perimeter of central opening 120, as in the embodiment shown in FIG. 1. In other embodiments (not shown), a second row of spaced apart resilient tabs may extend along only a portion of the perimeter of the central opening, and overlapping at least a portion of the first row.

While the embodiment shown in FIG. 1 includes only first and second rows of conductive tabs, it will be understood that additional rows of resilient conductive tabs can be present. However, this is not a requirement.

The conductive gasket 100 is shown in FIG. 1 as having a rectangular shape, and central opening 120 is also shown as having a rectangular shape. The first and second rows 130 and 140 are similarly shown as being arranged in a rectangular configuration, where the first row is parallel to the second row all around the perimeter of the central opening. While such a rectangular configuration is typical, deviations from a strictly rectangular shape can be made, including, for example, a circular shape, a triangular shape, or other two-dimensional shapes. The overall shapes of the gasket, the central opening, and the first and second rows can be various combinations of two-dimensional shapes (e.g., the gasket can be rectangular in shape, the central opening can be circular in shape, and the first and second rows of spaced apart resilient tabs can even have star-like configurations).

The resilient conductive tabs 135 and 145 in the first and second rows 130 and 140 extend outwardly from conductive base 110. Preferably, the spaced apart resilient conductive tabs 135 and 145 extend from first major surface 112 of conductive base 110, as in the embodiment shown in FIG. 1. In other embodiments (not shown), some of the spaced apart resilient conductive tabs 135 and 145 extending outwardly from conductive base 110 can extend outwardly from a second major surface 114, opposite first major surface 112. Conductive tabs 135 and 145 are configured to resiliently deflect when the gasket is compressed (i.e., the conductive tabs can be resiliently deflected towards a major surface of electrically conductive base 110).

The resilient conductive tabs can extend outwardly from the conductive base at a variety of angles (e.g., from greater than 0 degrees up to about 60 degrees) with respect to a major plane of the conductive base. While all of the resilient conductive tabs, in a non-deflected condition, can extend outwardly from the conductive base by the same angle (e.g., 45 degrees), this is not a requirement.

In some embodiments, each of the resilient conductive tabs 135 in the first row 130 is a deflected cut-out portion of the conductive base 110. In this way, production of gasket 100 can conveniently include a cutting and deflecting process to generate resilient conductive tabs 135. Preferably, conductive gasket 100 (including each of the spaced apart resilient conductive tabs) is a unitary structure.

Each resilient conductive tab in the first and second rows of spaced apart resilient conductive tabs can have a selected shape. In some embodiments, each resilient conductive tab in the first and second rows of spaced apart resilient conductive tabs has a square or a rectangular shape, although other shapes are also possible (e.g., a square or rectangular shape having rounded corners), as well as combinations of shapes among the resilient conductive tabs. The resilient conductive tabs within the same row can also have combinations of shapes among the resilient conductive tabs.

Figures 2, 3:
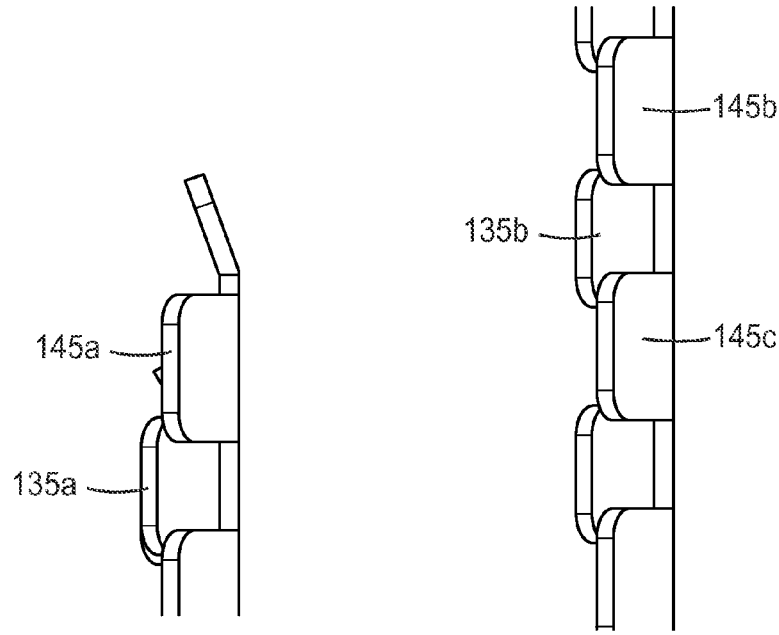
FIG. 2 is a partial edge view of the EMI gasket in FIG. 1, along arrow A.
FIG. 3 is a partial edge view of the EMI gasket in FIG. 1, along arrow B.

FIG. 2 provides an exemplary schematic of a portion of conductive gasket 100 in FIG. 1, viewed along arrow A, where at least one resilient conductive tab 145*a* in one row overlaps at least one resilient conductive tab 135*a* in the other row. In some embodiments, each resilient conductive tab 145*a* in one row partially overlaps at least resilient one conductive tab 135*a* in the other row.

FIG. 3 provides an exemplary schematic of another portion of conductive gasket 100 in FIG. 1, viewed along arrow B, showing that in some embodiments, each resilient conductive tab 135*b* in the first row partially overlaps each of two adjacent conductive tabs 145*b* and 145*c* in the second row.

In a conductive gasket of the present disclosure, the partially overlapping configuration of the resilient tabs in the first and second rows can provide enhanced blocking of EMI, in comparison with an EMI gasket having only a single row of resilient tabs, or even in comparison to an EMI gasket having two rows of non-overlapping resilient tabs.

Figure 4:
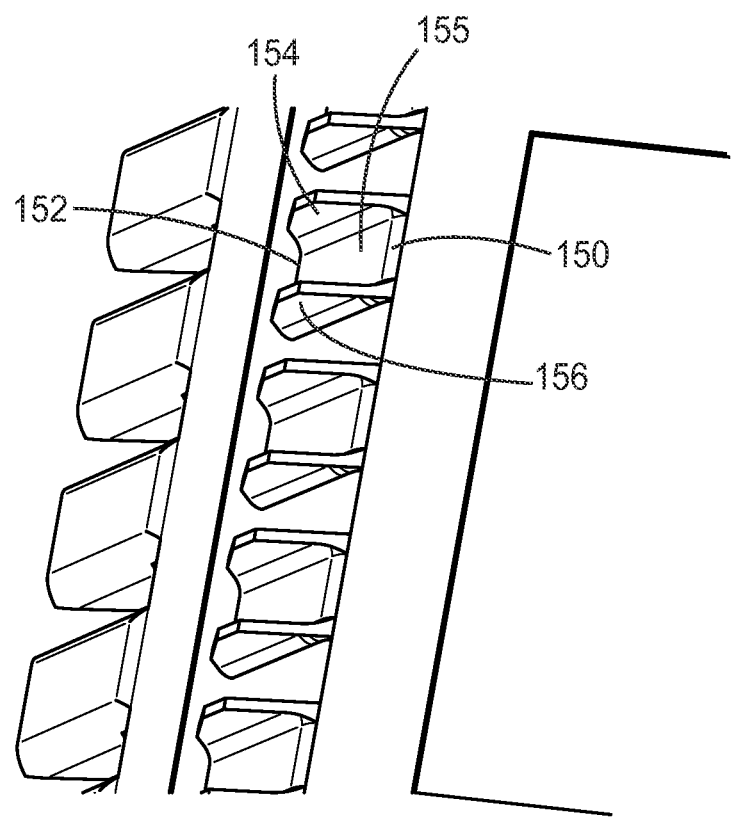
FIG. 4 is an exemplary partial perspective view of an EMI gasket.

FIG. 4 provides an exemplary schematic of a resilient conductive tab 155 that can be included in a conductive gasket of the present disclosure. In this embodiment, a sidewall feature is introduced on the resilient conductive tab to further enhance the EMI-blocking capability of the conductive gasket. Resilient conductive tab 155 has a fixed end 150 that is attached to the electrically conductive base, and a free end 152 opposite the fixed end 150. In some embodiments, at least one resilient conductive tab 155 has opposing first 154 and second 156 sidewalls. The first 154 and second 156 sidewalls extend at least partially from fixed end 150 to free end 152. The sidewalls are typically resilient, conductive, and of unitary construction with the resilient conductive tabs.

The first sidewall 154 and second sidewall 156 each have a height that increases, or tapers, from fixed end 150 to free end 152. The taper of sidewalls 154 and 156 can be suitably adjusted as needed to allow for optimal contact of the resilient conductive tabs with a surface that deflects the resilient conductive tabs (for example, when the conductive gasket is compressed against a conductive plate or housing). In some embodiments, each of the resilient conductive tabs in tab in the first and second rows of spaced apart resilient conductive tabs includes first 154 and second 156 sidewalls extending extend at least partially from fixed end 150 to the free end 152.

The sidewalls on a resilient conductive tab can be configured such that the first and second sidewalls are on a same side of the resilient tab, as in the embodiment shown in FIG. 4, where sidewalls 154 and 156 extend from a same side of a resilient tab. In other configurations (not shown), the sidewalls can each extend from opposite sides of a resilient tab.

Figure 5:
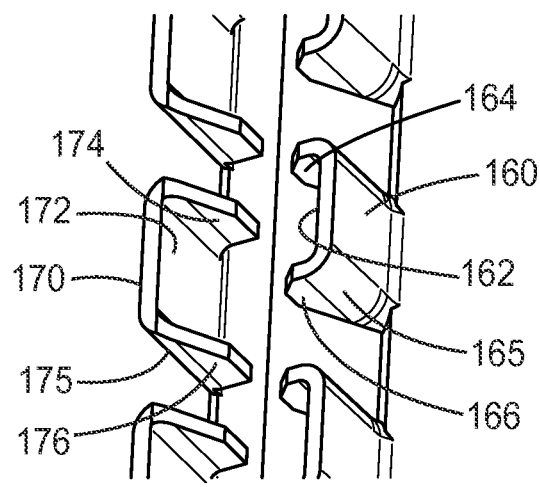
FIG. 5 is an exemplary partial perspective view of an EMI gasket.

FIG. 5 provides an exemplary schematic of a portion of a conductive gasket of the present disclosure, where a resilient conductive tab 165 in a first row at least partially overlaps a resilient conductive tab 175 in a second row. The resilient conductive tab 165 has a first major surface 162 that faces towards a first major surface 172 of resilient conductive tab 175. Resilient conductive tabs 165 and 175 also have corresponding second major surfaces 160 and 170, and these second major surfaces 160 and 170 face away from each other. The sidewalls 164 and 166 on resilient conductive tab 165 are configured to face towards resilient conductive tab 175, and the sidewalls 174 and 176 on resilient conductive tab 175 are configured to face towards resilient conductive tab 165. In other words, the first and second sidewalls of each of the first and second resilient conductive tabs are on the first major side (i.e., bent towards the first major surface) of their respective conductive tabs. In this configuration, the sidewalls on the resilient conductive tabs provide an enhanced overlap of the tabs in the first and second rows. Consequently, in an edge view of such a conductive gasket, first and second rows of resilient conductive tabs at least partially overlap, and in some configurations, a substantially complete overlap can be obtained, thus blocking paths for EMI transmission when the resilient conductive tabs are compressed against a conductive surface.

In an alternate embodiment (not shown), an EMI gasket of the present disclosure can closely resemble the embodiment shown in FIG. 5, except that while the sidewalls 164 and 166 on resilient conductive tab 165 are configured to face towards conductive tab 175, the sidewalls 174 and 176 on resilient conductive tab 175 are configured to face away from resilient conductive tab 165 (i.e., towards second major surface 170). In an edge view of such a conductive gasket, first and second rows of resilient conductive tabs can still at least partially overlap, and in some configurations, a substantially complete overlap can be obtained, again blocking paths for EMI transmission when the resilient conductive tabs are compressed against a conductive surface.

Figure 6:
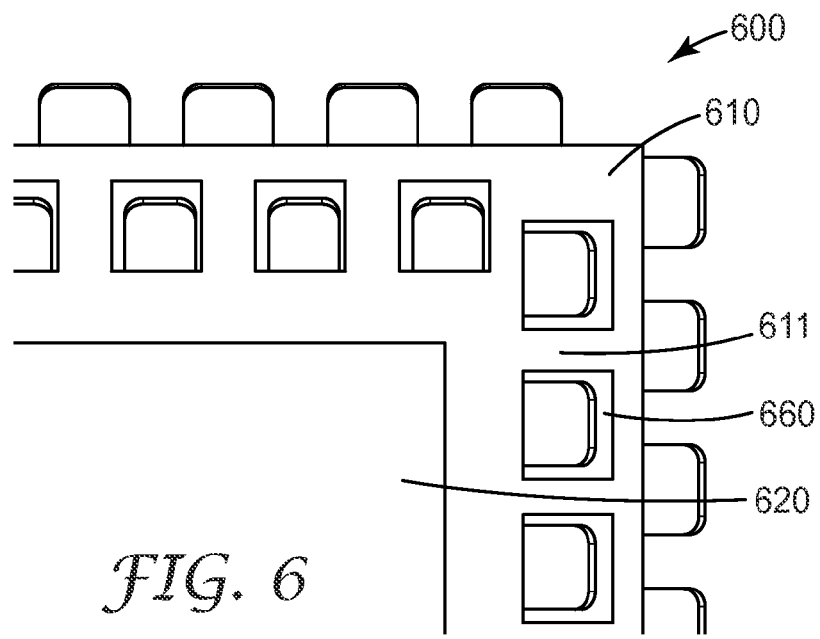
FIG. 6 is an exemplary partial plan view of an EMI gasket.

FIG. 6 provides an exemplary schematic of a portion of a conductive gasket 600 of the present disclosure having a row of spaced apart side openings 660 arranged around central opening 620. Each side opening 660 corresponds to a different resilient conductive tab in the first row of spaced apart resilient tabs. The spaced apart openings can have various configurations. For example, considering a plan view from above the central opening 620, each resilient conductive tab can have a smaller area than the corresponding side opening 660 in the first row of spaced apart resilient conductive tabs. In some configurations, a portion 611 of the conductive base 610 is disposed between at least one pair of neighboring resilient conductive tabs in the first row of spaced apart resilient conductive tabs. Such configurations allow for convenience in manufacture of a conductive gasket of the present disclosure by, for example, stamping the conductive gasket 600 from a unitary sheet of material.

Figure 7:
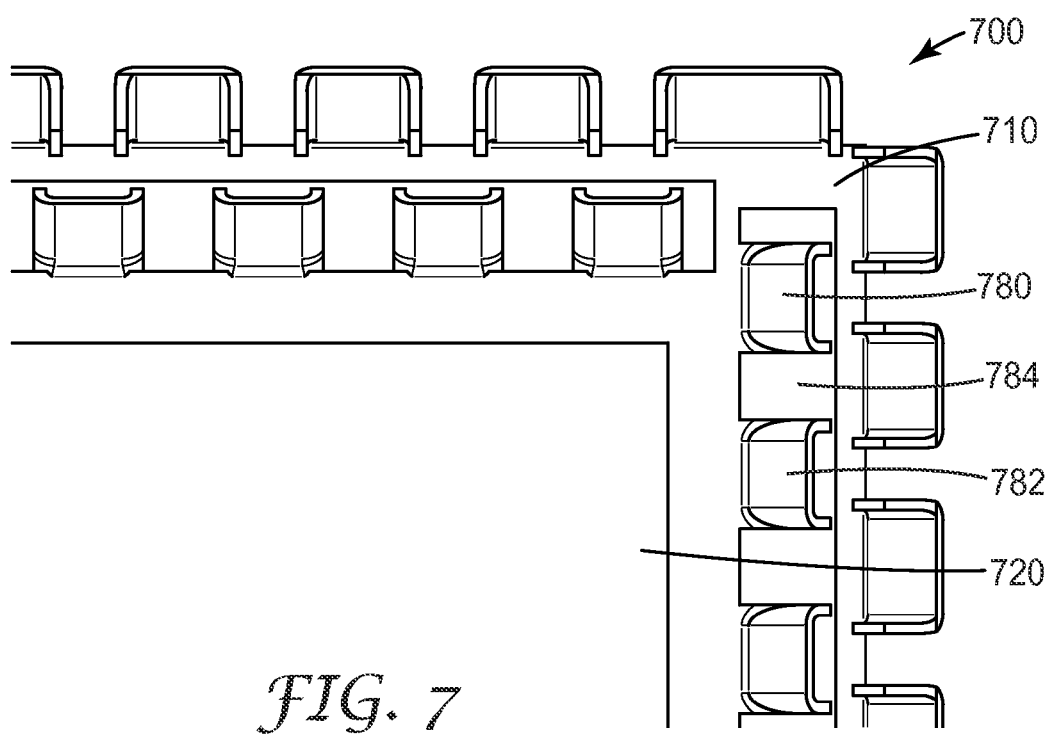
FIG. 7 is an exemplary partial plan view of an EMI gasket.

FIG. 7 provides an exemplary schematic of a portion of a conductive gasket 700 of the present disclosure, in a plan view from above conductive base 710 and central opening 720, showing at least one pair 780, 782 of neighboring conductive tabs in the first row of spaced apart resilient conductive tabs defines an opening 784 between the pair of neighboring conductive tabs that extends from one resilient conductive tab 780 to the other resilient conductive tab 782. Such a configuration provides an alternative for convenient manufacture of conductive gaskets having the sidewall features (described above with respect to FIGS. 4 and 5), again by, for example, stamping the conductive gasket 700 from a unitary sheet of material.

Figure 8:
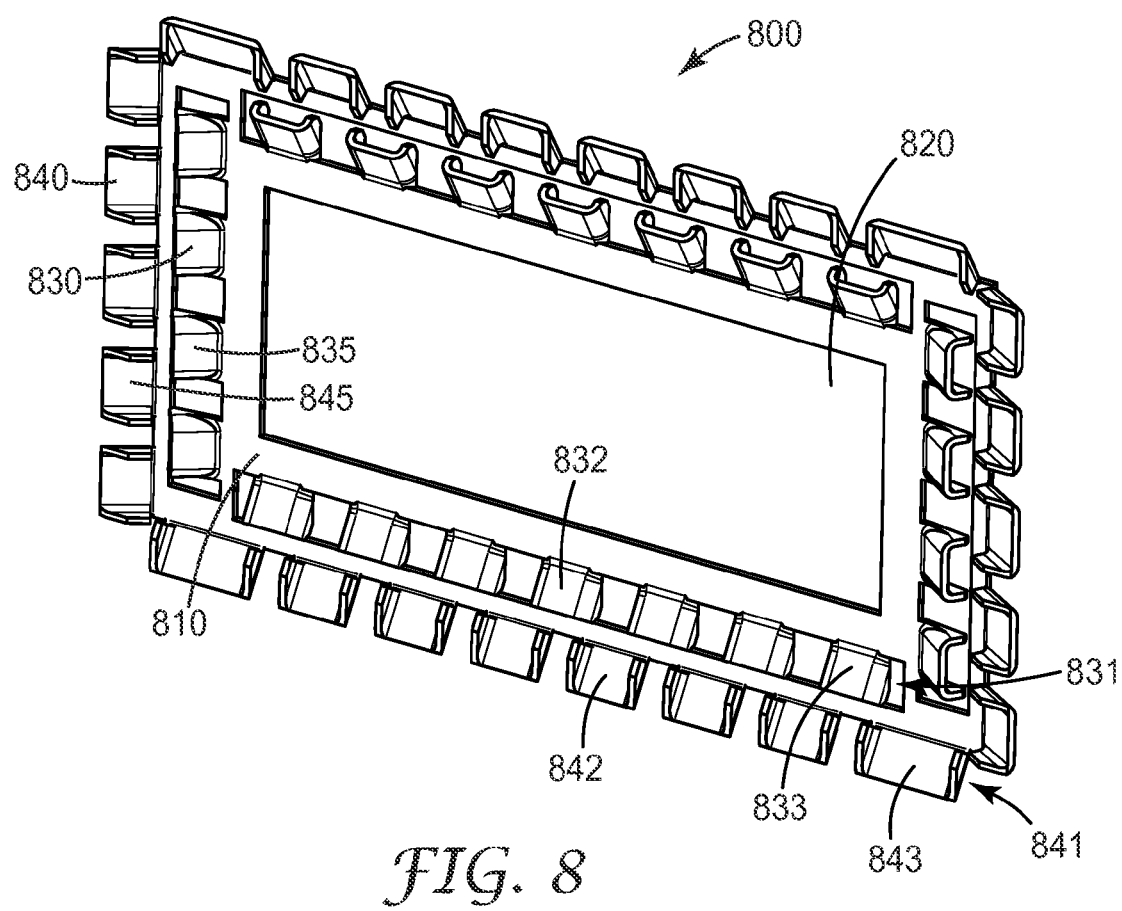
FIG. 8 is an exemplary perspective view of an EMI gasket.

FIG. 8 provides an exemplary schematic of a conductive gasket 800 that includes an electrically conductive base 810 defining a central opening 820 therein for receiving a portion of an electrical component (e.g., a plug connector or a portion of an EMI shielding cage; not shown). Two or more substantially parallel spaced apart polygonal rows 830, 840 of spaced apart resilient conductive tabs 835, 845 are disposed on the conductive base 810 and surround the central opening 820. The polygonal rows 830, 840 have edges 831 and 841, respectively, and each edge 831, 841 of each row 830, 840 have one or more resilient conductive middle tabs 832, 842, respectively, disposed between two resilient conductive end tabs 833, 843. Each middle tab in one row at least partially overlaps two middle tabs in an adjacent row. In some embodiments, electrically conductive gasket 800 is of a unitary construction.

Figure 9:
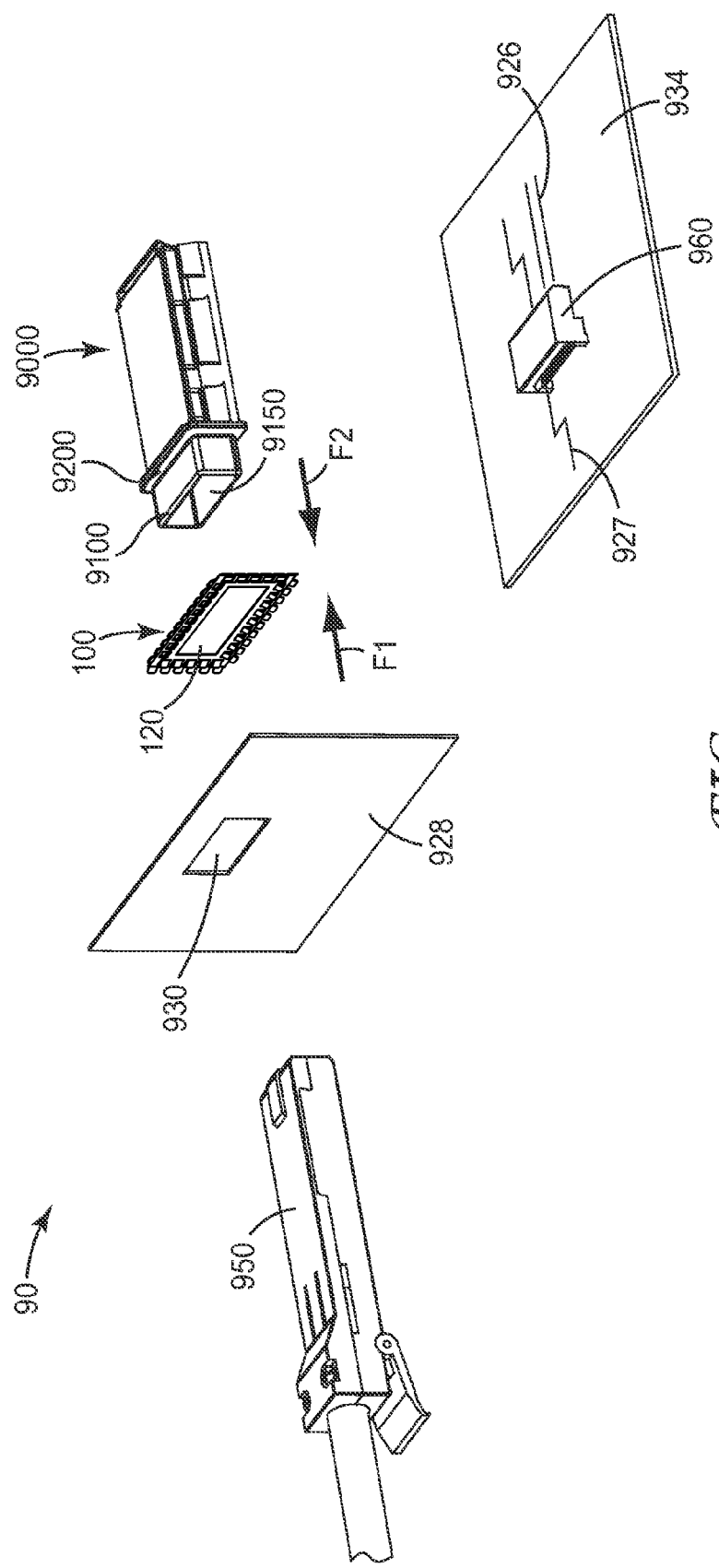
FIG. 9 is an exemplary exploded view of an EMI shielding cage, including an EMI gasket.

FIG. 9 provides an exploded view of an exemplary schematic of a shielding cage assembly 90 that includes shielding cage 9000 which can be used for housing an electronic module. The electronic module (e.g., plug connector 950) may be used to provide a connection between signal traces 926 on a printed circuit board (PCB) 934 and another electronic device (not shown). Such plug connectors are used commonly in data transmission servers and routers, for example. The plug connector 950 is plugged into an individual slot 9150 of the EMI shielding cage 9000 wherein a mating connector 960 is mounted to the PCB 934. The EMI shielding cage 9000 has an opening at a first end 9100 that communicates with the exterior of a device (not shown), preferably through an optional complementary faceplate 928 of the device. The EMI shielding cage 9000 is used to shield the connectors from external electromagnetic waves, as well as to contain electromagnetic waves emanating from the connectors.

The EMI shielding cage 9000 includes a housing having a top panel, a back panel, two side panels and at least one slot configured at a first end 9100 of the EMI shielding cage 9000 providing an enclosure for EMI shielding for at least one plug connector 950 when in use.

When in use, the opening at the first end 9100 of the EMI shielding cage 9000 is aligned with an opening 930 of the optional complementary faceplate 928 of the device (not shown). It is through the opening 930 that the first end 9100 of the EMI shielding cage 9000 will pass through and be ready to receive the plug connector 950. Since the optional complementary faceplate 928 is typically electrically conductive, it may provide some form of EMI suppression for the connectors. However, the dimensions of the opening 930 of the optional complementary faceplate 928 do not normally allow for a tight mechanical and electrical connection between the optional complementary faceplate 928 and external panels of the EMI shielding cage 9000. The improved electrical connection between the optional complementary faceplate 928 and exterior panels of the EMI shielding cage 9000 may be provided by an electrically conductive gasket 100 of the present disclosure that is disposed between EMI shielding cage 9000 and optional complementary faceplate 928.

In one embodiment, EMI shielding cage 9000 is electrically coupled to conductive ground traces 927 that exist on or within the PCB 934 on which the EMI shielding cage 9000 is disposed.

When in use, the optional complementary faceplate 928 exerts a force F1 on the resilient conductive tabs of the electrically conductive gasket 100 in the direction towards the EMI shielding cage 9000. In return, gasket mating walls 9200 near the first end 9100 of the EMI shielding cage 9000 exert an opposite force F2 on the resilient conductive tabs of the electrically conductive gasket 100. The differential force of F1 and F2 will determine the distance by which the optional complementary faceplate 928 may travel towards the mating gasket mating walls 9200.

When the EMI shielding cage 9000 and the optional complementary faceplate 928 are both pressed onto opposite major faces of the electrically conductive gasket 100, the resilient conductive tabs of the electrically conductive gasket 100 are resiliently deflected such that in an edge view of the electrically conductive gasket 100, at least one conductive tab in one row partially overlaps at least one conductive tab in the other row.

Various items are described that are articles of the present disclosure.

Item 1. An electrically conductive gasket (100) for use with an electrical component, comprising: an electrically conductive base (110) defining a central opening (120) therein for receiving a portion of an electrical component; a first row (130) of spaced apart resilient conductive tabs (135) arranged around the central opening; a second row (140) of spaced apart resilient conductive tabs (145) arranged around the central opening, the first row being located inside the second row, the conductive tabs in the first and second rows of the spaced apart resilient conductive tabs extending outwardly from the conductive base and being configured to resiliently deflect when the gasket is compressed, the conductive tabs in the first and second rows of the spaced apart resilient conductive tabs being staggered relative to each other, such that in an edge view of the gasket, at least one conductive tab (145*a*) in one row partially overlaps at least one conductive tab (135*a*) in the other row.

Item 2. The electrically conductive gasket of item 1, wherein in an edge view of the gasket, each conductive tab (145*a*) in one row partially overlaps at least one conductive tab (135*a*) in the other row.

Item 3. The electrically conductive gasket of item 1 or item 2, wherein each conductive tab (135*b*) in the first row partially overlaps each of two adjacent conductive tabs (145*b*, 145*c*) in the second row.

Item 4. The electrically conductive gasket of any preceding item, wherein the conductive tabs in the first and second rows of the spaced apart resilient conductive tabs extend outwardly from the conductive base on a same side of the conductive base.

Item 5. The electrically conductive gasket of any one of items 1 to 3, wherein some conductive tabs in the first and second rows of the spaced apart resilient conductive tabs extend outwardly from the conductive base on one side of the conductive base, and some other conductive tabs in the first and second rows of the spaced apart resilient conductive tabs extend outwardly from the conductive base on the opposite side of the conductive base.

Item 6. The electrically conductive gasket of any preceding item, wherein each conductive tab in the first row of spaced apart resilient conductive tabs is a deflected cut out portion of the conductive base.

Item 7. The electrically conductive gasket of any preceding item being a unitary structure.

Item 8. The electrically conductive gasket of any preceding item, the conductive tabs in the first and second rows of the spaced apart resilient conductive tabs being staggered relative to each other, such that in each edge view of the gasket, each conductive tab in one row partially overlaps at least one conductive tab in the other row.

Item 9. The electrically conductive gasket of any preceding item, wherein the first row is parallel to the second row.

Item 10. The electrically conductive gasket of any preceding item having a rectangular shape.

Item 11. The electrically conductive gasket of any preceding item, wherein the central opening is rectangular.

Item 12. The electrically conductive gasket of any preceding item, wherein each resilient conductive tab in the first and second rows of spaced apart resilient conductive tabs has a square or a rectangular shape.

Item 13. The electrically conductive gasket of any preceding item, wherein each resilient conductive tab in the first and second rows of spaced apart resilient conductive tabs comprises: a fixed end (150) attached to the base; a free end (152) opposite the fixed end; and at least one conductive tab in the first and second rows of spaced apart resilient conductive tabs further comprises opposing first (154) and second (156) sidewalls extending at least partially from the fixed end to the free end.

Item 14. The electrically conductive gasket of any preceding item, wherein each resilient conductive tab in the first and second rows of spaced apart resilient conductive tabs comprises: a fixed end (150) attached to the base; a free end (152) opposite the fixed end; and opposing first (154) and second (156) sidewalls extending at least partially from the fixed end to the free end.

Item 15. The electrically conductive gasket of item 14, wherein for at least one resilient conductive tab, a height of each of the first and second sidewalls increases from the fixed end to the free end.

Item 16. The electrically conductive gasket of any preceding item, wherein for at least one resilient conductive tab, the first and second sidewalls are on a same side of the resilient conductive tab.

Item 17. The electrically conductive gasket of item 14 or item 15, wherein for at least one resilient conductive tab, the first and second sidewalls are on opposite sides of the resilient conductive tab.

Item 18. The electrically conductive gasket of item 14, wherein in an edge view of the gasket, a first conductive tab (160) in the first row partially overlaps a second conductive tab (170) in the second row, each of the first and second conductive tabs having a first major side (162, 172) facing the other conductor tab and an opposite second major side (164, 174) facing away from the other conductor tab, the first and second sidewalls of each of the first and second conductive tabs being on the first major side of the conductive tab.

Item 19. The electrically conductive gasket of item 14, wherein in an edge view of the gasket, a first conductive tab (160) in the first row partially overlaps a second conductive tab (170) in the second row, each of the first and second conductive tabs having a first major side (162, 172) facing the other conductor tab and an opposite second major side (164, 174) facing away from the other conductor tab, the first and second sidewalls of one of the first and second conductive tabs being on the first major side of the conductive tab, and the first and second sidewalls of the other one of the first and second conductive tabs being on the second major side of the conductive tab.

Item 20. The electrically conductive gasket of any one of items 1 to 19, defining a first row of spaced apart side openings (179) arranged around the central opening, each side opening corresponding to a different resilient conductive tab in the first row of spaced apart resilient conductive tabs.

Item 21. The electrically conductive gasket of item 20, wherein in a plan view from above the central opening, each resilient conductive tab in the first row of spaced apart resilient conductive tabs that corresponds to a side opening in the first row of spaced apart side openings, has a smaller area than the side opening.

Item 22. The electrically conductive gasket of item 1, wherein in a plan view from above the central opening, a portion (112) of the conductive base is disposed between at least one pair of neighboring conductive tabs in the first row of spaced apart resilient conductive tabs.

Item 23. The electrically conductive gasket of item 1, wherein in a plan view from above the central opening, at least one pair (180, 182) of neighboring conductive tabs in the first row of spaced apart resilient conductive tabs defines an opening (184) between the pair of neighboring conductive tabs that extends from one conductive tab (180) to the other conductive tab (182).

Item 24. An electrically conductive gasket (200) for use with an electrical component, comprising: an electrically conductive base (210) defining a central opening (220) therein for receiving a portion of an electrical component; two or more substantially parallel spaced apart polygonal rows (300, 400) of spaced apart resilient conductive tabs (305, 405) disposed on the base and surrounding the central opening, each edge (310, 410) of each row having one or more resilient conductive middle tabs (320, 420) disposed between two resilient conductive end tabs (330, 430), each middle tab in one row at least partially overlapping two middle tabs in an adjacent row.

Item 25. The electrically conductive gasket of item 24 being a unitary construction.

Item 26. An electromagnetic interference (EMI) shielding cage assembly comprising: an EMI shielding cage comprising a housing having at least one slot configured at a first end of the EMI shielding cage configured to provide an enclosure and EMI shielding for at least one connector when in use; a conductive gasket for use with the EMI shielding cage, the gasket comprising: an electrically conductive base (110) defining a central opening (120) therein for receiving a portion of an electrical component; a first row (130) of spaced apart resilient conductive tabs (135) arranged around the central opening; a second row (140) of spaced apart resilient conductive tabs (145) arranged around the central opening, the first row being located inside the second row, the conductive tabs in the first and second rows of the spaced apart resilient conductive tabs extending outwardly from the conductive base and being configured to resiliently deflect when the gasket is compressed, the conductive tabs in the first and second rows of the spaced apart resilient conductive tabs being staggered relative to each other, such that in an edge view of the gasket, at least one conductive tab (145a) in one row partially overlaps at least one conductive tab (135a) in the other row, wherein when the first end of the EMI shielding cage is inserted into the central opening of the electrically conductive gasket and an opening of an optional complementary faceplate and the EMI shielding cage and the optional complementary faceplate are both pressed onto opposite major faces of the electrically conductive gasket, the resilient conductive tabs are resiliently deflected such that in an edge view of the gasket, at least one conductive tab (145a) in one row partially overlaps at least one conductive tab (135a) in the other row.

While the specification has described in detail certain exemplary embodiments, it will be appreciated that those skilled in the art, upon attaining an understanding of the foregoing, may readily conceive of alterations to, variations of, and equivalents to these embodiments. Various exemplary embodiments have been described. These and other embodiments are within the scope of the following claims.

What is claimed is:

1. An electrically conductive gasket for use with an electrical component, comprising:
   an electrically conductive base defining a central opening therein for receiving a portion of an electrical component;
   a first row of spaced apart resilient conductive tabs arranged around the central opening;
   a second row of spaced apart resilient conductive tabs arranged around the central opening, the first row being located inside the second row, the conductive tabs in the first and second rows of the spaced apart resilient conductive tabs extending outwardly from the conductive base and being configured to resiliently deflect when the gasket is compressed, the conductive tabs in the first and second rows of the spaced apart resilient conductive tabs being staggered relative to each other, such that in an edge view of the gasket, at least one conductive tab in one row partially overlaps at least one conductive tab in the other row, the electrically conductive gasket further defining a first row of spaced apart side openings arranged around the central opening, each side opening corresponding to a different resilient conductive tab in the first row of spaced apart resilient conductive tabs.

2. The electrically conductive gasket of claim 1, wherein in an edge view of the gasket, each conductive tab in one row partially overlaps at least one conductive tab in the other row.

3. The electrically conductive gasket of claim 1, wherein each conductive tab in the first row partially overlaps each of two adjacent conductive tabs in the second row.

4. The electrically conductive gasket of claim 1, wherein the conductive tabs in the first and second rows of the spaced apart resilient conductive tabs extend outwardly from the conductive base on a same side of the conductive base.

5. The electrically conductive gasket of claim 1, the conductive tabs in the first and second rows of the spaced apart resilient conductive tabs being staggered relative to each other, such that in each edge view of the gasket, each conductive tab in one row partially overlaps at least one conductive tab in the other row.

6. The electrically conductive gasket of claim 1, wherein each resilient conductive tab in the first and second rows of spaced apart resilient conductive tabs comprises:
   a fixed end attached to the base;
   a free end opposite the fixed end; and
   at least one conductive tab in the first and second rows of spaced apart resilient conductive tabs further comprises opposing first and second sidewalls extending at least partially from the fixed end to the free end.

7. The electrically conductive gasket of claim 6, wherein for at least one resilient conductive tab, a height of each of the first and second sidewalls increases from the fixed end to the free end.

8. The electrically conductive gasket of claim 6, wherein for at least one resilient conductive tab, the first and second sidewalls are on a same side of the resilient conductive tab.

9. The electrically conductive gasket of claim 1, wherein some conductive tabs in the first and second rows of the spaced apart resilient conductive tabs extend outwardly from the conductive base on one side of the conductive base, and some other conductive tabs in the first and second rows of the spaced apart resilient conductive tabs extend outwardly from the conductive base on the opposite side of the conductive base.

10. The electrically conductive gasket of claim 1, wherein each conductive tab in the first row of spaced apart resilient conductive tabs is a deflected cut out portion of the conductive base.

11. The electrically conductive gasket of claim 1 being a unitary structure.

12. The electrically conductive gasket of claim 1, wherein the first row is parallel to the second row.

13. The electrically conductive gasket of claim 1 having a rectangular shape.

14. The electrically conductive gasket of claim 1, wherein the central opening is rectangular.

15. The electrically conductive gasket of claim 1, wherein each resilient conductive tab in the first and second rows of spaced apart resilient conductive tabs has a square or a rectangular shape.

16. The electrically conductive gasket of claim 1, wherein each resilient conductive tab in the first and second rows of spaced apart resilient conductive tabs comprises: a fixed end attached to the base; a free end opposite the fixed end; and opposing first and second sidewalls extending at least partially from the fixed end to the free end.

17. The electrically conductive gasket of claim 16, wherein for at least one resilient conductive tab, the first and second sidewalls are on opposite sides of the resilient conductive tab.

18. The electrically conductive gasket of claim 16, wherein in an edge view of the gasket, a first conductive tab in the first row partially overlaps a second conductive tab in the second row, each of the first and second conductive tabs having a first major side facing the other conductor tab and an opposite second major side facing away from the other conductor tab, the first and second sidewalls of each of the first and second conductive tabs being on the first major side of the conductive tab.

19. The electrically conductive gasket of claim 16, wherein in an edge view of the gasket, a first conductive tab in the first row partially overlaps a second conductive tab in the second row, each of the first and second conductive tabs having a first major side facing the other conductor tab and an opposite second major side facing away from the other conductor tab, the first and second sidewalls of one of the first and second conductive tabs being on the first major side of the conductive tab, and the first and second sidewalls of the other one of the first and second conductive tabs being on the second major side of the conductive tab.

20. The electrically conductive gasket of claim 1, wherein in a plan view from above the central opening, each resilient conductive tab in the first row of spaced apart resilient conductive tabs that corresponds to a side opening in the first row of spaced apart side openings, has a smaller area than the side opening.

21. The electrically conductive gasket of claim 1, wherein in a plan view from above the central opening, a portion of the conductive base is disposed between at least one pair of neighboring conductive tabs in the first row of spaced apart resilient conductive tabs.

22. The electrically conductive gasket of claim 1, wherein in a plan view from above the central opening, at least one pair of neighboring conductive tabs in the first row of spaced apart resilient conductive tabs defines an opening between the pair of neighboring conductive tabs that extends from one conductive tab to the other conductive tab.

23. An electrically conductive gasket for use with an electrical component, comprising: an electrically conductive base defining a central opening therein for receiving a portion of an electrical component; two or more substantially parallel spaced apart polygonal rows of spaced apart resilient conductive tabs disposed on the base and surrounding the central opening, each edge of each row having one or more resilient conductive middle tabs disposed between two resilient conductive end tabs, each middle tab in one row at least partially overlapping two middle tabs in an adjacent row, the electrically conductive gasket further defining a first row of spaced apart side openings arranged around the central opening, each side opening corresponding to a different resilient conductive tab in the first row of spaced apart resilient conductive tabs.

24. The electrically conductive gasket of claim 23 being a unitary construction.

\* \* \* \* \*